United States Patent
Takaba

(10) Patent No.: US 8,962,454 B2
(45) Date of Patent: Feb. 24, 2015

(54) METHOD OF DEPOSITING DIELECTRIC FILMS USING MICROWAVE PLASMA

(75) Inventor: Hiroyuki Takaba, Portland, OR (US)

(73) Assignee: Tokyo Electron Limited, Tokyo (JP)

( * ) Notice: Subject to any disclaimer, the term of this patent is extended or adjusted under 35 U.S.C. 154(b) by 328 days.

(21) Appl. No.: 13/073,957

(22) Filed: Mar. 28, 2011

(65) Prior Publication Data

US 2012/0115334 A1 May 10, 2012

Related U.S. Application Data

(60) Provisional application No. 61/410,155, filed on Nov. 4, 2010.

(51) Int. Cl.
*H01L 21/00* (2006.01)
*H01L 21/20* (2006.01)
*H01L 21/36* (2006.01)
*H01L 21/02* (2006.01)

(52) U.S. Cl.
CPC .... *H01L 21/02118* (2013.01); *H01L 21/02126* (2013.01); *H01L 21/02167* (2013.01); *H01L 21/02211* (2013.01); *H01L 21/02274* (2013.01)
USPC ........... 438/478; 438/485; 438/726; 438/784; 257/E21.247; 257/E21.268; 257/E21.282

(58) Field of Classification Search
USPC .......... 438/478, 485, 726, 784; 257/E21.247, 257/E21.268, E21.282
See application file for complete search history.

(56) References Cited

U.S. PATENT DOCUMENTS

| | | | |
|---|---|---|---|
| 2005/0106858 A1 | 5/2005 | Cheng et al. | |
| 2006/0040483 A1* | 2/2006 | Niimi et al. | 438/591 |
| 2007/0283887 A1 | 12/2007 | Tian et al. | |
| 2009/0065146 A1 | 3/2009 | Yamashita | |
| 2009/0159214 A1* | 6/2009 | Kasai | 156/345.41 |
| 2009/0246937 A1 | 10/2009 | Yamazaki et al. | |
| 2010/0032844 A1 | 2/2010 | Ohmi | |
| 2010/0117204 A1 | 5/2010 | Matsuoka | |

OTHER PUBLICATIONS

Katsuno, T. et al, "Highly photoconductive carbon nitride film prepared by cyclic nitrogen radical sputtering", Applied Physics Letters vol. 85, No. 14, Oct. 2004, pp. 2803-2805.
Rodil, S E. et al, "Maximized sp3 bonding in carbon nitride phases", Applied Physics Letters vol. 77, No. 10, Sep. 2000, pp. 1458-1460.
Takada, N. et al., "Preparation and properties of reactive-sputtered amorphous CNx films", Applied Surface Science 113/114 (1997), pp. 274-277.

(Continued)

*Primary Examiner* — Mohsen Ahmadi

(57) ABSTRACT

Embodiments of the invention describe a method for forming dielectric films for semiconductor devices. The method includes providing a substrate in a process chamber containing a microwave plasma source, introducing into the process chamber a non-metal-containing process gas including a deposition gas having a carbon-nitrogen intermolecular bond, forming a plasma from the process gas, and exposing the substrate to the plasma to deposit carbon-nitrogen-containing film on the substrate. In some embodiments, the carbon-nitrogen-containing film can include a CN film, a CNO film, a Si-doped CN film, or a Si-doped CNO film.

14 Claims, 8 Drawing Sheets

(56) References Cited

OTHER PUBLICATIONS

Aono, M. et al., "Characterization of low dielectric constant amorphous carbon nitride films", Applied Surface Science 159-160 (2000), pp. 341-344.
Iwasaki, T. et al., "Structural and electronic properties of highly photoconductive amorphous carbon nitride", Diamond and Related Materials 8 (1999) pp. 440-445.
Bhattacharyya, S. et al., "Studies on structural properties of a-CN:H films prepared in electron cyclotron resonance plasma", Diamond and Related Materials 8 (1999) pp. 586-590.
Katsuno, T. et al., "Properties of amorphous carbon nitride a-CNx films prepared by the layer-by-layer method", Diamond and Related Materials 12 (2003) pp. 1887-1890.
Aono, M. et al., "The effect of hydrogen- and oxygen-plasma treatments on dielectric properties of amorphous carbon nitride films", Diamond and Related Materials 10 (2001) pp. 1147-1151.
Aono, M et al., "High resistivity and low dielectric constant amorphous carbon nitride films: application to low-k materials for ULSI", Diamond and Related Materials 11 (2002) pp. 1219-1222.
Mazumder, M.K. et al., "Properties of boron carbon nitride (BCN) film after plasma processing", Diamond and Related Materials 18 (2009) pp. 419-422.
Ishikawa, H. et al., "Evaluation of New Amorphous Hydrocarbon Film for Copper Barrier Dielectric Film in Low-k Copper Metallization", Japanese Journal of Applied Physics, vol. 47, No. 4, 2008, pp. 2531-2534.
Nitta, S. et al., "Preparation and properties of photoconductive amorphous carbon nitrid a-CNx films: the layer-by-layer method", Journal of Non-Crystalline Solids, 227-230 (1998), pp. 655-658.
Ferrari, A.C. et al., "Determination of bonding in amorphous carbons by electron energy loss spectroscopy, Raman scattering and X-ray reflectivity", Journal of Non-Crystalline Solids, 266-269 (2000), pp. 765-768.
Ferrari, A.C. et al., "Interpretation of Raman spectra of disordered and amorphous carbon", Physical Review B, vol. 61, No. 20, May 2000, pp. 14095-14107.
"Properties of Amorphous Carbon", edited by Silva, S.R.P., Published by INSPEC, 2003, The Institute of Electrical Engineers, London, United Kingdom, Chapter 10.9 by S. Nitta and M. Aono, Jan. 2002, pp. 342-343.
"Chemical Properties", Zumdahl, S.S., Second Edition. 1995, published by D.C. Heath and Comparny, p. 592.
Taiwan Patent Office, Examination Opinion for corresponding Taiwan Application No. 100139385, Issued Nov. 21, 2013, 13 pages.
Wu, J.J. et al. "Effect of dilution gas on SiCN film growth using methylamine", Materials Chemistry and Physics 72 (2001), pp. 240-244.
United States Patent and Trademark Office, International Search Report and Written Opinion for corresponding International Application No. PCT/US11/58283, mailed May 8, 2012, 10 pages.
Naruse et al., "Preparation and properties of amorphous carbon oxynitrides a-CNxOy films made by a nitrogen radical sputter method and by the layer-by-layer method", Mat. Res. Soc. Symp. Proc. vol. 675 (2001) pp. W10.5.1-W10.5.6.

\* cited by examiner

METHOD OF DEPOSITING DIELECTRIC FILMS USING MICROWAVE PLASMA

CROSS-REFERENCE TO RELATED APPLICATIONS

This application is related to and claims priority to U.S. Provisional application Ser. No. 61/410,155 filed on Nov. 4, 2010, the entire contents of which are herein incorporated by reference.

FIELD OF THE INVENTION

The present invention generally relates to depositing dielectric films on a substrate using a microwave plasma source.

BACKGROUND OF THE INVENTION

Current thickness and dielectric constant scaling remain a difficult challenge for future copper (Cu) capping/etch stop technologies and there are tradeoffs between density, which improves barrier properties, and dielectric constant, which increases with density. Difficult challenges include identifying materials with good adhesion to the low-dielectric constant (low-k) interlayer dielectric (ILD) and Cu, Cu out diffusion and $H_2O_2/O_2$ in diffusion prevention, electromigration and leakage, and compatibility with Cu interconnect processing such as ILD etch, photoresist ashing, etc.

The scaling of current low-k SiCN and SiCO capping layer technologies are expected to continue; however, research is needed on the feasibility of monolayer thick capping layers with a dielectric constant of <4.0, since current SiN/SiCN/SiCO materials are expected to fail at these dimensions. Another high potential impact research challenge is the elimination of the dielectric capping layer/etch stop layer by implementing selectively deposited metallic capping layers (such as cobalt metal) or self forming CuSiN barriers. Also, initial investigation of self assembled monolayers (SAMs), as the top side capping layer, has been demonstrated to reduce surface oxides, and curtail in-plane Cu transport and electrical leakage. But, the best results with amino-phenyl terminated SAMs represented only 50% of the leakage performance of a SiN capping layer.

Additionally, to warrant potential solution consideration, more research is needed to address several challenges related to SAMs as top side Cu capping layers, which include: low-k ILD deposition compatibility (thermal stability, plasma damage, etc.), Cu/low-k ILD and top side low-k ILD adhesion, diffusion barrier performance to Cu and $O_2/H_2O$ diffusion, and compatibility with interconnect processing (wet/dry etch, CMP, etc.). Other candidate capping layer materials that require additional research to address these material challenges include, but are not limited to: a-C:H, CNx, and BCNx, which exhibit low-k (k<3.9), some compatibility with interconnect processing, and the ability to impede Cu diffusion.

SUMMARY OF THE INVENTION

Embodiments of the invention describe a method for forming dielectric films using a microwave plasma source, for example a microwave plasma source containing a radial line slot antenna (RLSA). The dielectric films can include low-k dielectric films containing CN, CNO, Si-doped CN films, and Si-doped CNO films, for example.

According to one embodiment, a method is provided for forming a semiconductor device. The method includes providing a substrate in a process chamber containing a microwave plasma source, introducing in the process chamber a non-metal-containing process gas including a deposition gas having a carbon-nitrogen intermolecular bond (e.g., C—N, C═N, or C≡N), forming a plasma from the process gas, and exposing the substrate to the plasma to deposit a carbon-nitrogen-containing film on the substrate. In some embodiments, the deposition gas having a carbon-nitrogen intermolecular bond can include an alkylamine gas or a R—CN gas, where R can be H, NC, or a halogen, for example.

In one embodiment, the carbon-nitrogen-containing film can contain a carbon-nitrogen (CN) film.

In another embodiment, the non-metal-containing process gas can further include an oxygen-containing gas and the carbon-nitrogen-containing film can contain a carbon-nitrogen-oxygen (CNO) film.

In yet another embodiment, the non-metal-containing process gas can further include a silicon-containing gas and the carbon-nitrogen-containing film can contain a silicon-doped carbon-nitrogen (Si-doped CN) film.

In still another embodiment, the non-metal-containing process gas can further include a silicon-containing gas and an oxygen-containing gas and the carbon-nitrogen-containing film can contain a silicon-doped carbon-nitrogen-oxygen (Si-doped CNO) film.

DETAILED DESCRIPTION OF SEVERAL EMBODIMENTS

Figure 1:
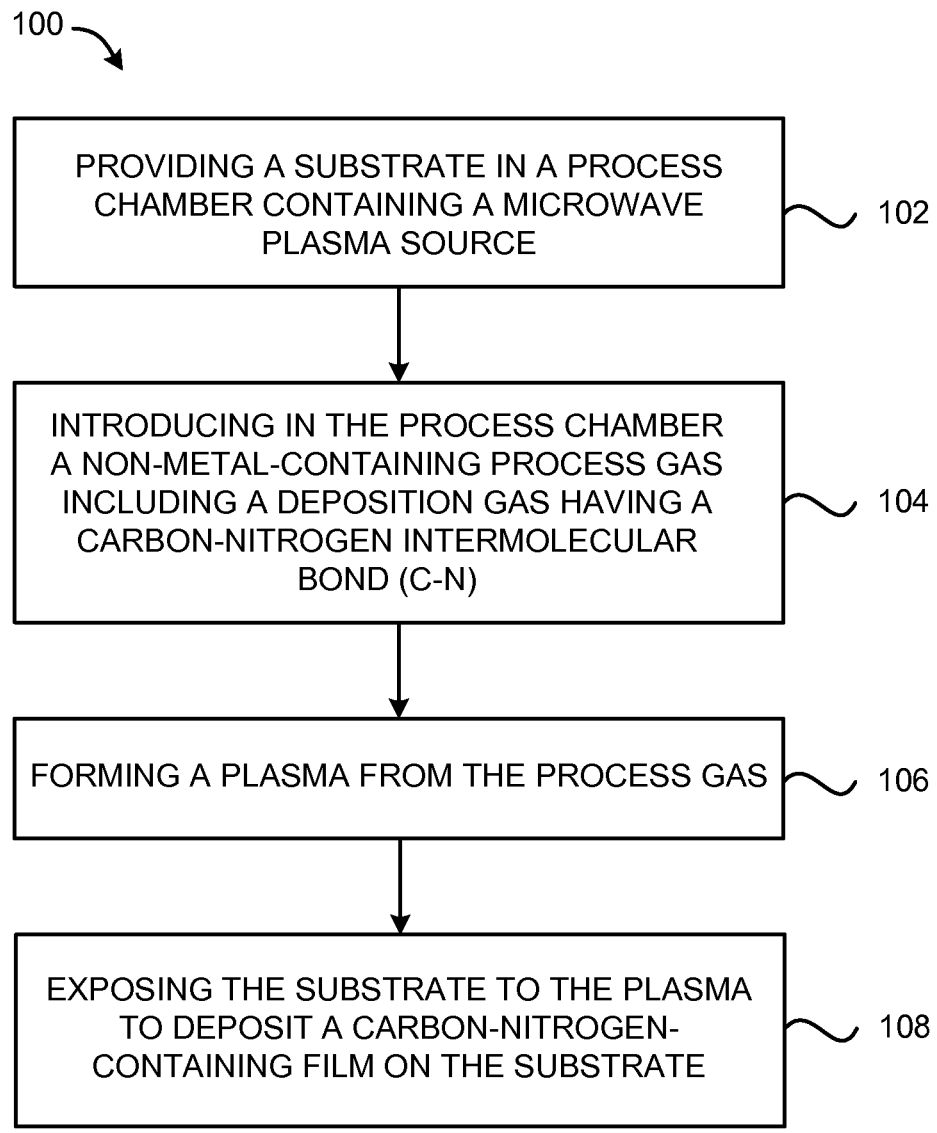
FIG. 1 is a flow diagram for forming a carbon-nitrogen-containing film according to an embodiment of the invention.

Methods for depositing dielectric films, including low-k dielectric films, on a substrate using a microwave plasma source are described in various embodiments. The low-k dielectric films have a dielectric constant lower than that of $SiO_2$ (k~3.9), lower than 3.5, lower than 3, lower than 2.5, or even lower than 2. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" means that a particular feature, structure, material, or characteristic described in connection with the embodiment is included in at least one embodiment of the invention, but do not denote that they are present in every embodiment. Thus, the appearances of the phrase "in one embodiment" in various places throughout this specification are not necessarily referring to the same embodiment of the invention.

There is a general need in semiconductor manufacturing for new methods for forming low-k ILDs, low-k barrier layers, low-k passivation layers as hermetic seals over a semiconductor circuit, low-k etch stop layers, and other layers. Embodiments of the invention provide methods for depositing dielectric films using a microwave plasma that is characterized by low electron temperature and high plasma density and enables deposition of CN, CNO, Si-doped CN, and Si-doped CNO films with materials properties such as low-k that are required for advanced semiconductor devices.

According to embodiments of the invention, the use of a microwave plasma source, for example the radial line slot antenna (RLSA) plasma processing systems schematically shown in FIGS. 6-9, allow the user to select low electron temperature in the plasma, for example below 5 electron volt (eV), below 4.5 eV, below 4 eV, or even below 3.5 eV. In some examples, the electron temperature can be between 3.0 and 3.5 eV, between 3.5 eV and 4.0 eV, or between 4.0 and 4.5 eV. The electron temperature can be selected in view of the desired molecular bond in the process gas to be broken, thereby controlling the gas dissociation in the microwave plasma and controlling formation of gas species that react to form a dielectric film on a substrate. According to embodiments of the invention, microwave plasma conditions may be used to control the material properties, including film composition, film density, and dielectric constant (k), of the deposited dielectric films. Such targeted bond dissociation is not possible using conventional plasma sources which create high electron temperature distributions (e.g., greater than 10 eV) and tend to dissociate gas molecules in the plasma into various molecular fragments with little or no control over the gas species formed, and thus limited control over the material properties of the low-k films.

Table I shows bond energies between elements C, N, and H.

| Bond | Energy (eV) | Bond | Energy (eV) |
|---|---|---|---|
| C—N | 3.17 | C—H | 4.30 |
| C—C | 3.61 | C=C | 8.73 |
| N—H | 4.07 | H—H | 4.49 |
| C=C | 6.39 | C=N | 6.40 |
| C≡N | 9.27 | N≡N | 9.79 |

Table I shows that typical bond energies of single bonds between C, N, and H increase in the following order: 3.17 eV (C—N)<3.61 (C—C)<4.30 eV (C—H)<4.49 eV (H—H). Further, typical bond energies of double bonds between C and N increase in the following order: 6.39 eV for C=C<6.40 eV for C=N. Still further, typical bond energies of triple bonds between C and N increase in the following order: 8.73 eV for C≡C<9.27 eV for C≡N<9.79 eV for N≡N.

Many process gases that may be used for depositing dielectric films contain several of the chemical bonds shown in Table I. Embodiments of the invention allow the user to select electron temperature in the plasma that target low energy chemical bonds and break them in the plasma processing environment, while other higher energy chemical bonds are not broken. This is accomplished by using a microwave plasma source that generates a low electron temperature plasma (for example, with electron temperatures below 5 eV). In contrast, conventional radio frequency (RF) plasma sources generate plasma with higher electron temperature, for example greater than 10 eV. Such conventional RF plasma dissociate all or most of the chemical bonds listed in Table I, thereby providing poor control over the material properties of the films formed. For example, many process gases that may be used for depositing dielectric films contain C—H bonds and breakage of the C—H bond in a plasma can lead to undesirably high H-content in the deposited dielectric films.

According to one embodiment of the invention, in view of Table I, a microwave plasma with an electron temperature below that of a C—H bond (4.30 eV) in the process gas may be selected to prevent or reduce breakage of the C—H bond in the plasma and thereby reduce the H-content of the deposited dielectric film. In one example, a trimethylamine gas (N(CH$_3$)$_3$) may be used in the process gas and selecting an electron temperature below 4.3 eV, for example, 4 eV or less, is expected to break one or more C—N bonds in the N(CH$_3$)$_3$ molecule, without breaking C—H bonds in the CH$_3$ chemical groups. This results in deposition of dielectric films with desired low H-content. In another example, a R—C≡N molecule may be used in the process gas and a microwave plasma with an electron temperature below that of the C≡N bond (9.27 eV) but at or above the R—C bond (e.g., C—C bond energy of 3.61 eV) may be selected to break the R—C bond without breaking the C≡N bond. The formed C≡N gas species can then provide the C≡EN building block for various dielectric films, for example CN, CNO, Si-doped CN, and Si-doped CNO. Herein, R represents H, NC, or a halogen, for example.

FIG. 1 is a flow diagram 100 for forming a carbon-nitrogen-containing film according to an embodiment of the invention. The flow diagram 100 includes, in 102, providing a substrate in a process chamber of a plasma processing system containing a microwave plasma source. The microwave plasma source can, for example, include a radial line slot antenna (RLSA) schematically shown in FIGS. 6-9. The substrate can, for example, be a semiconductor substrate, such as a silicon substrate, a silicon-germanium substrate, a germanium substrate, a glass substrate, a LCD substrate, or a compound semiconductor substrate, such as GaAs. The substrate can be of any size, for example, a 200 mm wafer, a 300 mm wafer, or an even larger wafer or substrate.

In 104, a non-metal-containing process gas that includes a deposition gas having a carbon-nitrogen intermolecular bond is introduced into the process chamber. The gas pressure in the process chamber can, for example, be maintained between about 10 mTorr and about 20 Torr, for example between about 100 mTorr and about 10 Torr, or between about 100 mTorr and about 5 Torr. Further, the substrate can be maintained at a substrate temperature between about −50° C. and about 800° C., for example about 25° C., about 100° C., about 200° C., about 300° C., or about 400° C. Alternatively, the substrate temperature can be between about 400° C. and about 700° C. In some examples, substrate temperatures of about 350° C. and below may be required when depositing the dielectric film on temperature sensitive substrates. In those cases, the substrate temperature can be between about −50° C. and about 350° C., or between about 100° C. and about 350° C.

According to embodiments of the invention, the non-metal-containing process gas and the deposited carbon-nitrogen-containing films do not contain a metal element. The deposition gas having a carbon-nitrogen intermolecular bond can include an alkylamine gas or a R—CN gas. The alkylamine gas can be selected from trimethylamine (($N(CH_3)_3$)), dimethylethylamine ($N(CH_3)_2(C_2H_5)$), diethylmethylamine ($N(C_2H_5)_2CH_3$), triethylamine ($N(C_2H_5)_3$), dimethylamine ($NH(CH_3)_2$), diethylamine ($NH(C_2H_5)_2$), methylamine ($NH_2CH_3$), ethylamine ($NH_2(C_7H_5)$), or a combination thereof. The R—CN gas may be selected from HCN, $CH_3CN$, NCCN, and X—CN where X is a halogen. X can be selected from F, Cl, Br, or I. In some embodiments the non-metal-containing process gas can further include an oxygen-containing gas. The oxygen-containing gas can, for example, be selected from $O_2$, CO, $H_2O$, $H_2O_2$, NO, $N_2O$, and $NO_2$. In yet other embodiments, the non-metal-containing process gas can further include a silicon-containing gas. The silicon-containing gas can, for example, be selected from silane ($SiH_4$), disilane ($Si_2H_6$), and $Si_aH_bX_c$ compounds, wherein X denotes a halogen and a, b, c are integers greater than or equal to unity. Exemplary $Si_aH_bX_c$ compounds include $SiH_2Cl_2$ and $SiHCl_3$. Furthermore, the non-metal-containing process gas can contain Argon (Ar) or Helium (He).

In 106, a plasma is formed in the process chamber from excitation of the process gas by the microwave plasma source. The plasma may be characterized by low electron temperature and high plasma density that enables deposition of low-k films. High plasma density may include ion density of about or in excess of $1\times10^{11}/cm^3$, for example between about $1\times10^{11}/cm^3$ to about $1\times10^{13}/cm^3$, or higher.

In 108, the substrate is exposed to the plasma to deposit a carbon-nitrogen-containing film on the substrate. According to one embodiment of the invention, the carbon-nitrogen-containing film can include a carbon-nitrogen (CN) film with carbon and nitrogen as the major constituents and the non-metal-containing process gas can include or consist of an alkylamine gas and/or a R—CN gas, or a combination thereof, and optionally Ar or He. According to another embodiment of the invention, the carbon-nitrogen-containing film can contain a carbon-nitrogen-oxygen (CNO) film with carbon, nitrogen, and oxygen as the major constituents and the non-metal-containing process gas can include or consist of an oxygen-containing gas, an alkylamine gas and/or a R—CN gas, and optionally Ar or He. According to yet another embodiment of the invention, the carbon-nitrogen-containing film can contain a silicon-doped carbon-nitrogen (Si-doped CN) film with carbon and nitrogen as the major constituents, 0.1-10 atomic percent Si, and the non-metal-containing process gas can include or consist of a silicon-containing gas, an alkylamine gas and/or a R—CN gas, and optionally Ar or He. According to still another embodiment of the invention, the carbon-nitrogen-containing film can contain a silicon-doped carbon-nitrogen-oxygen (Si-doped CNO) film with carbon, nitrogen, and oxygen as the major constituents and 0.1-10 atomic percent Si, and the non-metal-containing process gas can include or consist of a silicon-containing gas, an oxygen-containing gas, an alkylamine gas and/or a R—CN gas, and optionally Ar or He. However, the CN, CNO, Si-doped CN, and Si-doped CNO films may further include small amounts of impurities, for example hydrogen (H) or a halogen. It is contemplated that the Si doping increases the thermal stability of the films. According to some embodiment of the invention, a thickness of the CN, CNO, Si-doped CN, and Si-doped CNO films can be between about 10 nanometers (nm) and about 200 nm, or between about 20 nm and about 100 nm.

Figure 2:
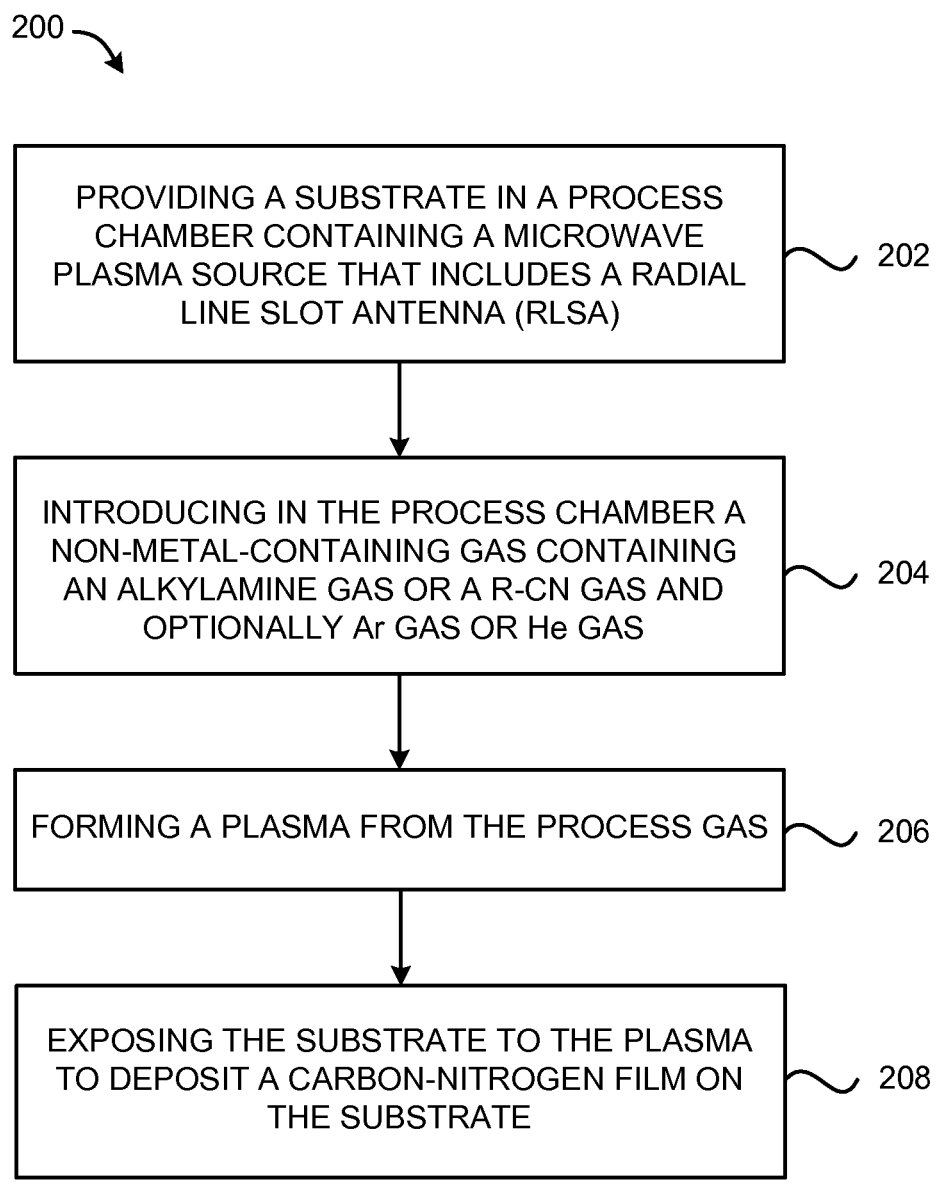
FIG. 2 is a flow diagram for forming a carbon-nitrogen (CN) film according to an embodiment of the invention.

FIG. 2 is a flow diagram 200 for forming a carbon-nitrogen (CN) film according to an embodiment of the invention. The flow diagram 200 is similar to the flow diagram 100 in FIG. 1 and includes, in 202, providing a substrate in a process chamber containing a microwave plasma source that includes a radial line slot antenna (RLSA). In 204, a non-metal-containing process gas that includes an alkylamine gas or a R—CN gas and optionally Ar gas or He gas is introduced into the process chamber. In 206, a plasma is formed in the process chamber from excitation of the process gas by the microwave plasma source. In 208, the substrate is exposed to the plasma to deposit a carbon-nitrogen (CN) film on the substrate. In some embodiments, the CN film can have a dielectric constant of less than 2, for example about 1.9.

Figure 3:
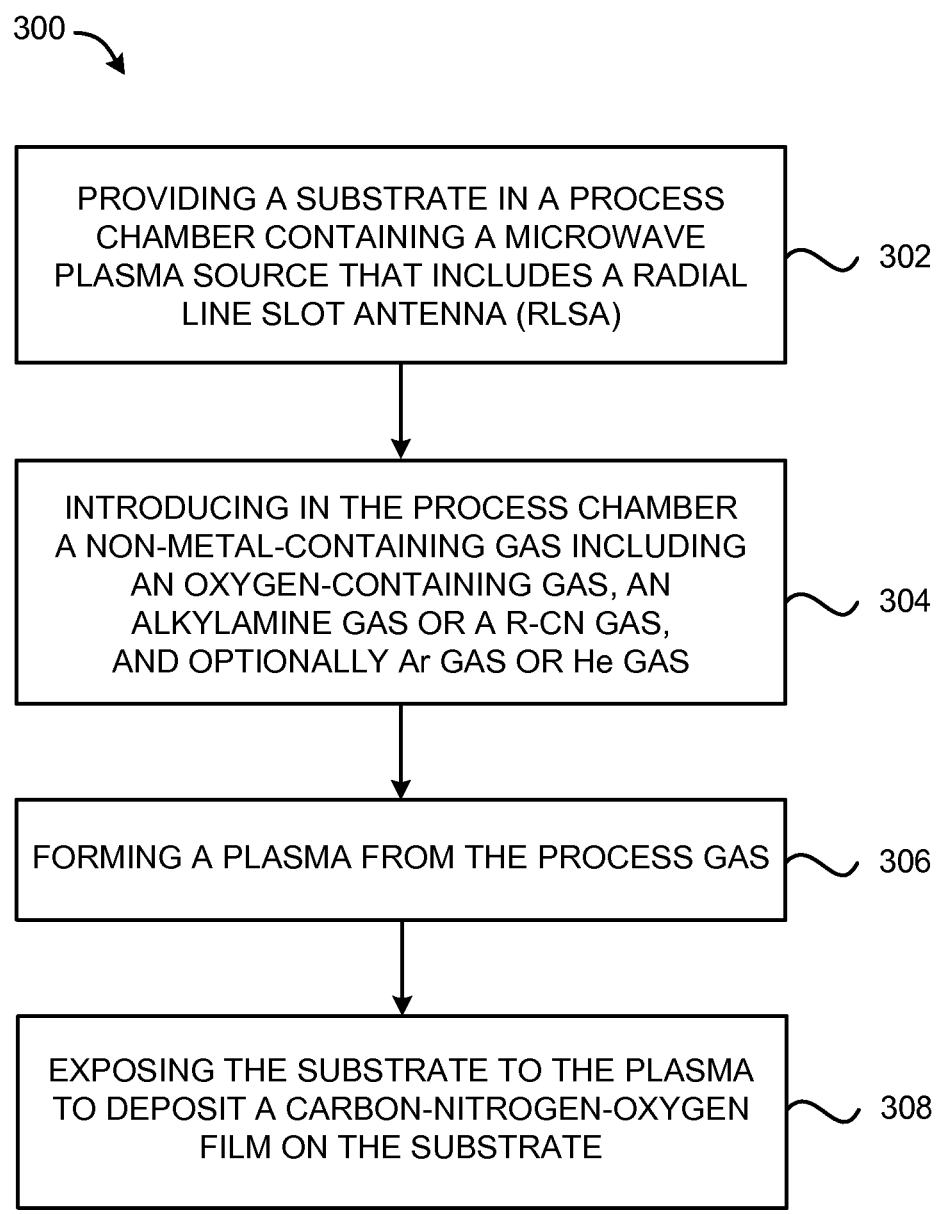
FIG. 3 is a flow diagram for forming a carbon-nitrogen-oxygen (CNO) film according to an embodiment of the invention.

FIG. 3 is a flow diagram 300 for forming a carbon-nitrogen-oxygen (CNO) film according to an embodiment of the invention. The flow diagram 300 is similar to the flow diagram 100 in FIG. 1 and includes, in 302, providing a substrate in a process chamber containing a microwave plasma source that includes a radial line slot antenna (RLSA). In 304, a non-metal-containing process gas that includes an oxygen-containing gas, an alkylamine gas or a R—CN gas, and optionally Ar gas or He gas is introduced into the process chamber. In 306, a plasma is formed in the process chamber from excitation of the process gas by the microwave plasma source. In 308, the substrate is exposed to the plasma to deposit a carbon-nitrogen-oxygen (CNO) film on the substrate.

Figure 4:
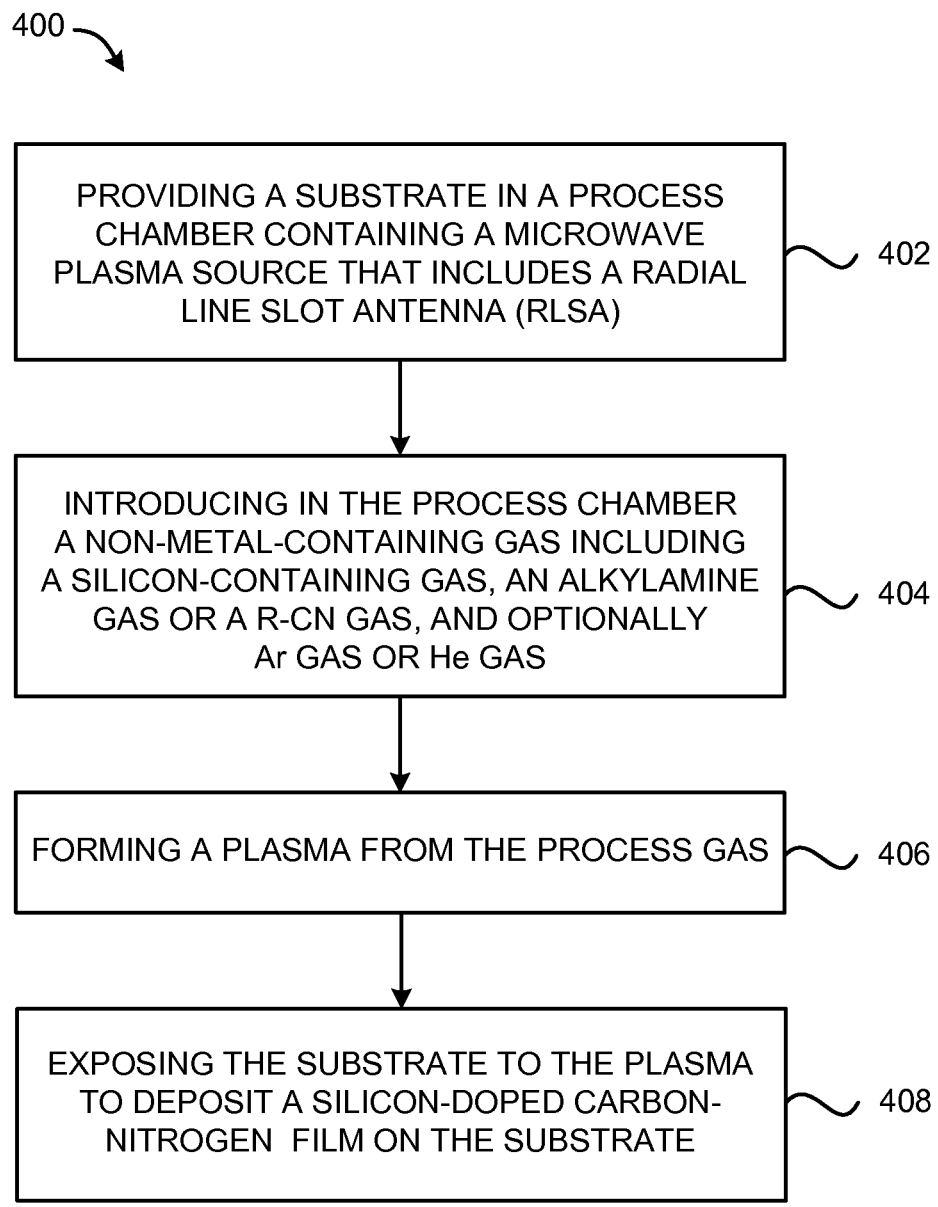
FIG. 4 is a flow diagram for forming a silicon-doped carbon-nitrogen (Si-doped CN) film according to an embodiment of the invention.

FIG. 4 is a flow diagram 400 for forming a silicon-doped carbon-nitrogen (Si-doped CN) film according to an embodiment of the invention. The flow diagram 400 is similar to the flow diagram 100 in FIG. 1 and includes, in 402, providing a substrate in a process chamber containing a microwave plasma source that includes a radial line slot antenna (RLSA). In 404, a non-metal-containing process gas that includes silicon-containing gas, an alkylamine gas or a R—CN gas, and optionally Ar gas or He gas is introduced into the process chamber. In 406, a plasma is formed in the process chamber from excitation of the process gas by the microwave plasma source. In 408, the substrate is exposed to the plasma to deposit a silicon-doped carbon-nitrogen (Si-doped CN) film on the substrate.

Figure 5:
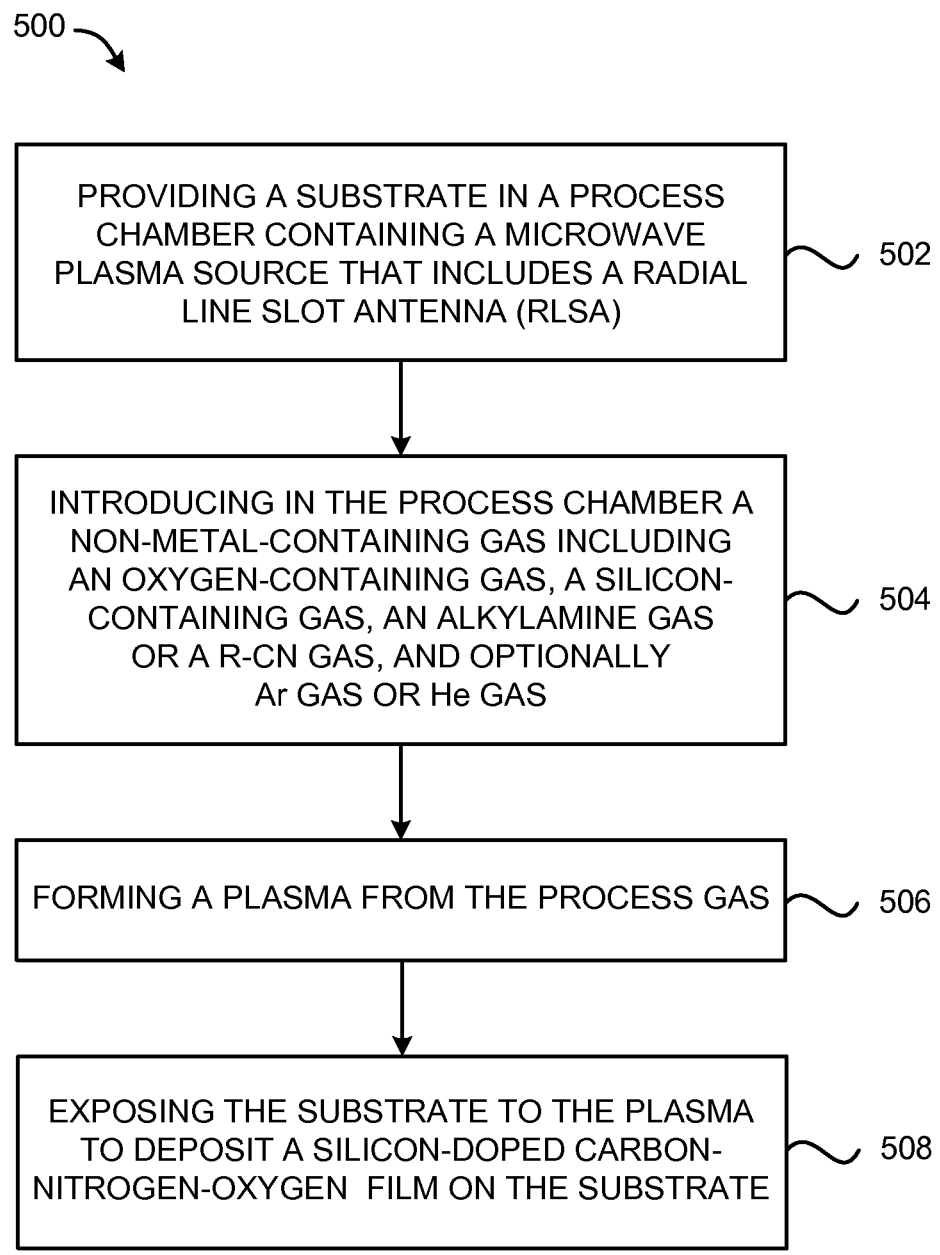
FIG. 5 is a flow diagram for forming a silicon-doped carbon-nitrogen-oxygen (Si-doped CNO) film according to an embodiment of the invention.

FIG. 5 is a flow diagram 500 for forming a silicon-doped carbon-nitrogen-oxygen (Si-doped CNO) film according to an embodiment of the invention. The flow diagram 500 is similar to the flow diagram 100 in FIG. 1 and includes, in 502, providing a substrate in a process chamber containing a microwave plasma source that includes a radial line slot antenna (RLSA). In 504, a non-metal-containing process gas that includes an oxygen-containing gas, a silicon-containing gas, an alkylamine gas or a R—CN gas, and optionally Ar gas or He gas is introduced into the process chamber. In 506, a plasma is formed in the process chamber from excitation of the process gas by the microwave plasma source. In 508, the substrate is exposed to the plasma to deposit a silicon-doped carbon-nitrogen-oxygen (Si-doped CNO) film on the substrate.

Figure 6:
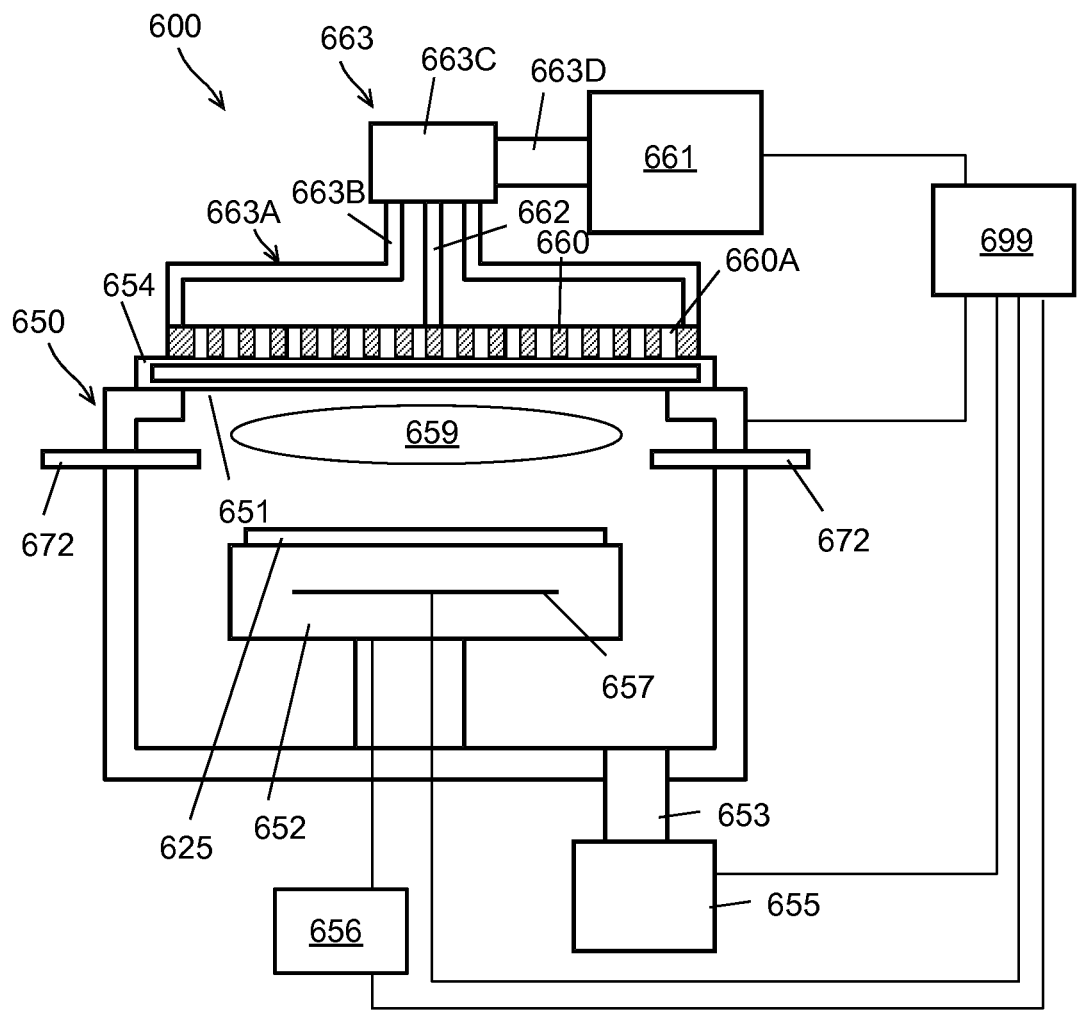
FIG. 6 is a schematic diagram of a plasma processing system containing a radial line slot antenna (RLSA) plasma source for depositing a dielectric film on a substrate according to one embodiment of the invention.

FIG. 6 is a schematic diagram of a plasma processing system containing a RLSA plasma source for depositing a dielectric film on a substrate according to one embodiment of the invention. The plasma produced in the plasma processing system 600 is characterized by low electron temperature and high plasma density that enables deposition of low-k CN, CNO, Si-doped CN, and Si-doped CNO films, for example.

The plasma processing system 600 can, for example, be a TRIAS™ SPA processing system from Tokyo Electron Limited, Akasaka, Japan. The plasma processing system 600 contains a process chamber 650 having an opening portion 651 in the upper portion of the process chamber 650 that is larger than a substrate 625. A cylindrical dielectric top plate 654 made of quartz or aluminum nitride or aluminum oxide is provided to cover the opening portion 651.

Gas lines 672 are located in the side wall of the upper portion of process chamber 650 below the top plate 654. In one example, the number of gas lines 672 can be 16 (only two of which are shown in FIG. 6). Alternatively, a different number of gas lines 672 can be used. The gas lines 672 can be circumferentially arranged in the process chamber 650, but this is not required for the invention. A non-metal-containing process gas can be evenly and uniformly supplied into a plasma region 659 in process chamber 650 from the gas lines 672. According to embodiments of the invention, the non-metal-containing process gas does not contain a metal element. The non-metal-containing process gas includes a deposition gas having a carbon-nitrogen intermolecular bond and can include an alkylamine gas, R—CN gas, or a combination thereof. The alkylamine gas can be selected from trimethylamine (($N(CH_3)_3$)), dimethylethylamine ($N(CH_3)_2(C_2H_5)$), diethylmethylamine ($N(C_2H_5)_2CH_3$), triethylamine ($N(C_2H_5)_3$), dimethylamine ($NH(CH_3)_2$), diethylamine ($NH(C_2H_5)_2$), methylamine ($NH_2CH_3$), ethylamine ($NH_2(C_2H_5)$), or a combination thereof. The R—CN gas may be selected from HCN, $CH_3CN$, NCCN, and X—CN where X is a halogen. X can be selected from F, Cl, Br, or I. In some embodiments the non-metal-containing process gas can further include an oxygen-containing gas. The oxygen-containing gas can, for example, be selected from $O_2$, CO, $H_2O$, $H_2O_2$, NO, $N_2O$, and $NO_2$. In yet other embodiments, the non-metal-containing process gas can further include a silicon-containing gas. The silicon-containing gas can, for example, be selected from silane ($SiH_4$), disilane ($Si_2H_6$), and $Si_aH_bX_c$ compounds, wherein X denotes a halogen, and a, b, c, are integers greater than or equal to unity. Exemplary $Si_aH_bX_c$ compounds include $SiH_2Cl_2$ and $SiHCl_3$. Furthermore, the non-metal-containing process gas can contain Argon (Ar) or Helium (He).

In the plasma processing system 600, microwave power is provided to the process chamber 650 through the top plate 654 via a slot antenna 660 having a plurality of slots 660A. The slot antenna 660 faces the substrate 625 to be processed and the slot antenna 660 can be made from a metal plate, for example copper. In order to supply the microwave power to the slot antenna 660, a waveguide 663 is disposed on the top plate 654, where the waveguide 663 is connected to a microwave power supply 661 for generating microwaves with a frequency of about 2.45 GHz, for example. The waveguide 663 contains a coaxial waveguide 663A with a lower end connected to the slot antenna 660, a coaxial waveguide 663B connected to the upper surface side of the circular waveguide 663A, and a coaxial waveguide converter 663C connected to the upper surface side of the coaxial waveguide 663B. Furthermore, a rectangular waveguide 663D is connected to the side surface of the coaxial waveguide converter 663C and the microwave power supply 661.

Inside the coaxial waveguide 663B, an axial portion (inner conductor) 662 of an electroconductive material is coaxially provided, so that one end of the axial portion 662 is connected to the central (or nearly central) portion of the upper surface of slot antenna 660, and the other end of the axial portion 662 is connected to the upper surface of the coaxial waveguide 663B, thereby forming a coaxial structure. The microwave power can, for example, be between about 0.5 W/cm² and about 4 W/cm². Alternatively, the microwave power can be between about 0.5 W/cm² and about 3 W/cm². The microwave irradiation may contain a microwave frequency of about 300 MHz to about 10 GHz, for example about 2.45 GHz, and the plasma may contain an electron temperature of less than or equal to 5 eV, including 1, 1.5, 2, 2.5, 3, 3.5, 4, 4.5 or 5 eV, or any combination thereof. In other examples, the electron temperature can be below 5 eV, below 4.5 eV, below 4 eV, or even below 3.5 eV. In some examples, the electron temperature can be between 3.0 and 3.5 eV, between 3.5 eV and 4.0 eV, or between 4.0 and 4.5 eV. The plasma may have a density of about $1\times10^{11}/cm^3$ to about $1\times10^{13}/cm^3$, or higher.

In addition, in the process chamber 650, a substrate holder 652 is provided opposite the top plate 654 for supporting and heating a substrate 625 (e.g., a wafer). The substrate holder 652 contains a heater 657 to heat the substrate 625, where the heater 657 can be a resistive heater. Alternatively, the heater 657 may be a lamp heater or any other type of heater. Furthermore, the process chamber 650 contains an exhaust line 653 connected to the bottom portion of the process chamber 650 and to a vacuum pump 655.

The plasma processing system 600 further contains a substrate bias system 656 configured to optionally bias the substrate 625 for controlling energy of ions that are drawn to a substrate. The substrate bias system 656 includes a substrate power source configured to couple power to the substrate holder 652. The substrate power source contains a RF generator and an impedance match network. The substrate power source is configured to couple power to the substrate holder 652 by energizing an electrode in the substrate holder 652. A typical frequency for the RF bias can range from about 0.1 MHz to about 100 MHz, and can be 13.56 MHz. In some examples, the RF bias can be less than 1 MHz, for example less than 0.8 MHz, less than 0.6 MHz, less than 0.4 MHz, or even less than 0.2 MHz. In one example, the RF bias can be about 0.4 MHz. Alternatively, RF power is applied to the electrode at multiple frequencies. RF bias systems for plasma processing are well known to those skilled in the art. In other embodiments, the substrate bias system 656 may include a DC generator. In other examples, no RF bias is applied to the substrate holder and the substrate holder is either electrically grounded or electrically floating. According to some embodiments, the substrate bias system 656 may include a DC generator capable of supplying DC voltage bias between −5 kV and +5 kV to the substrate holder 652.

The substrate bias system 656 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Exemplary RF bias power can be between 0 W and 100 W, between 100 W and 200 W, between 200 W and 300 W, between 300 W and 400 W, or between 400 W and 500 W. It is noted that one skilled in the art will appreciate that the power levels of the substrate bias system 656 are related to the size of the substrate being processed. For example, a 300 mm Si wafer requires greater power consumption than a 200 mm wafer during processing.

Still referring to FIG. 6, a controller 699 includes a microprocessor, a memory, and a digital I/O port capable of generating control voltages sufficient to communicate and activate inputs of the plasma processing system 600 as well as monitor outputs from the plasma processing system 600. Moreover, the controller 699 is coupled to and exchanges information with process chamber 650, the vacuum pump 655, the heater 657, and the microwave power supply 661. A program stored in the memory is utilized to control the aforementioned components of plasma processing system 600 according to a stored process recipe. One example of controller 699 is a UNIX-based workstation. Alternatively, the controller 699 can be implemented as a general-purpose computer, digital signal processing system, etc.

Depositing low-k dielectric films in the plasma processing system 600 can include a substrate temperature between about −25° C. and about 800° C., for example about 100° C., about 200° C., about 300° C., or about 400° C. Alternatively, the substrate temperature can be between about 400° C. and about 700° C. In some examples substrate temperatures of about 350° C. and below may be required when depositing the dielectric film on temperature sensitive substrates. In those cases the substrate temperature can be between about −50° C. and about 350° C., or between about 100° C. and about 350° C. The pressure in the process chamber 650 can, for example, be maintained between about 10 mTorr and about 20 Torr, for example between about 100 mTorr and about 10 Torr, or between about 100 mTorr and about 5 Torr.

Figure 7:
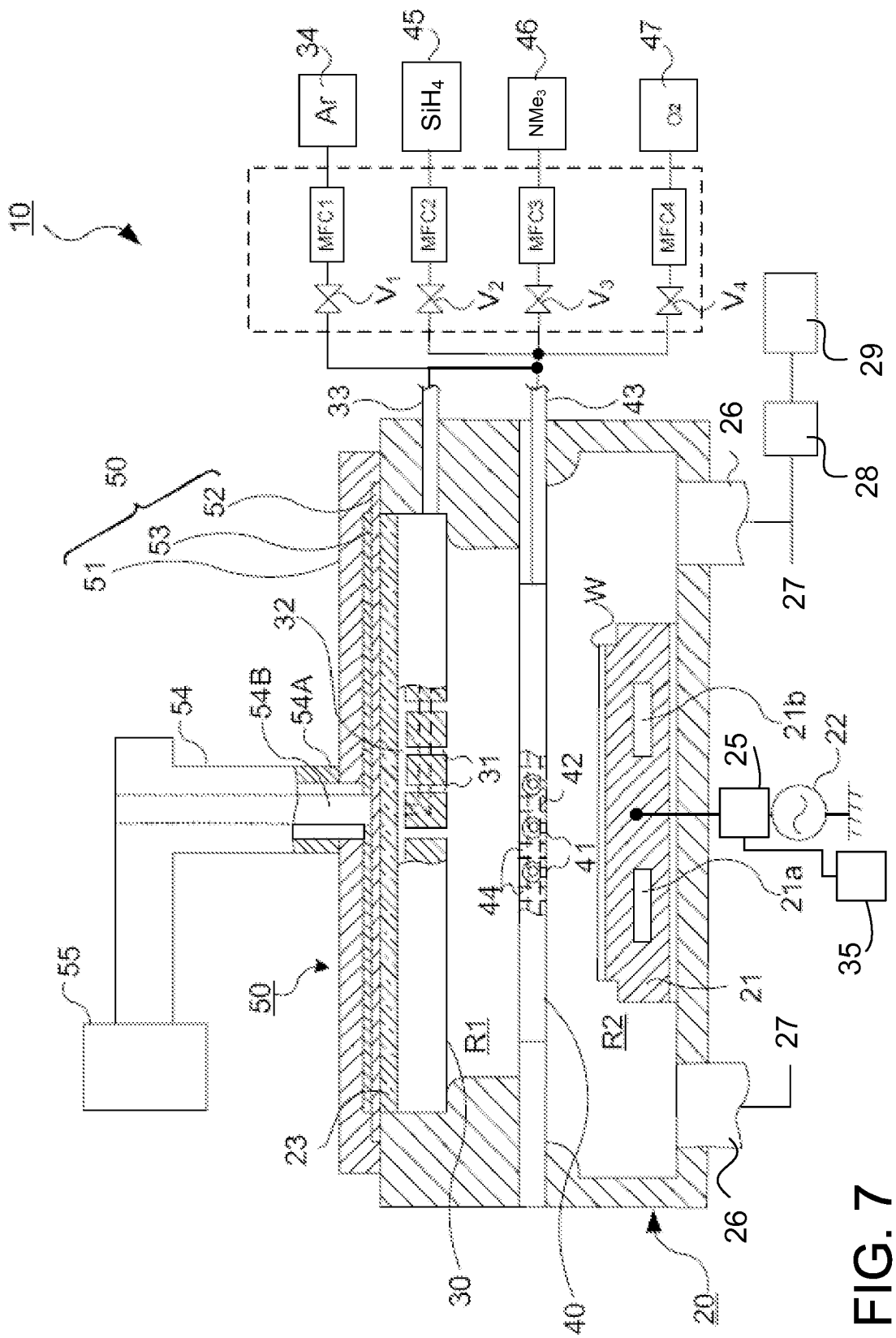
FIG. 7 is a schematic diagram of another plasma processing system containing a radial line slot antenna (RLSA) plasma source for depositing a dielectric film on a substrate according to one embodiment of the invention.

FIG. 7 is a schematic diagram of another plasma processing system containing a radial line slot antenna (RLSA) plasma source for depositing a dielectric film on a substrate according to one embodiment of the invention. As shown in this figure, the plasma processing system 10 includes a process chamber 20 (vacuum chamber), an antenna unit 50 (RLSA), and a substrate holder 21. The interior of process chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, where the film formation process is performed, the electron temperature of the plasma near the substrate holder 21 drops to a value of lower than about 2 eV. The substrate holder 21 is located centrally on a bottom portion of the process chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the process chamber 20 is opened-ended. The plasma gas supply unit 30 is placed opposite to the substrate holder 21 and is attached to the top portion of the process chamber 20 via sealing members, not shown in this figure, such as O rings. The plasma gas supply unit 30, which may also function as a dielectric window, is made of materials such as, for example, aluminum oxide or quartz and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. A plasma gas supply source 34 provides plasma gas such as, for example, Argon (Ar) gas, Helium (He) gas, Krypton (Kr) gas, or other inert gases, into the plasma gas supply port 33. The plasma gas is then uniformly supplied into the plasma generation region. R1 via the plurality of gas supply holes 31.

The plasma processing system 10 further includes a process gas supply unit 40, which is located substantially at the centre of the process chamber 20 between the plasma generation region R1 and the plasma diffusion region R2. The process gas supply unit 40 is made of conducting materials such as, for example, aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a virtual disk shape.

The process chamber 20 further includes an exhaust lines 26 connected to the bottom portion of the process chamber 20, a vacuum line 27 connecting the exhaust line to a pressure controller valve 28 and to a vacuum pump 29. The pressure controller valve 28 may be used to achieve a desired gas pressure in the process chamber 20.

Figure 8:
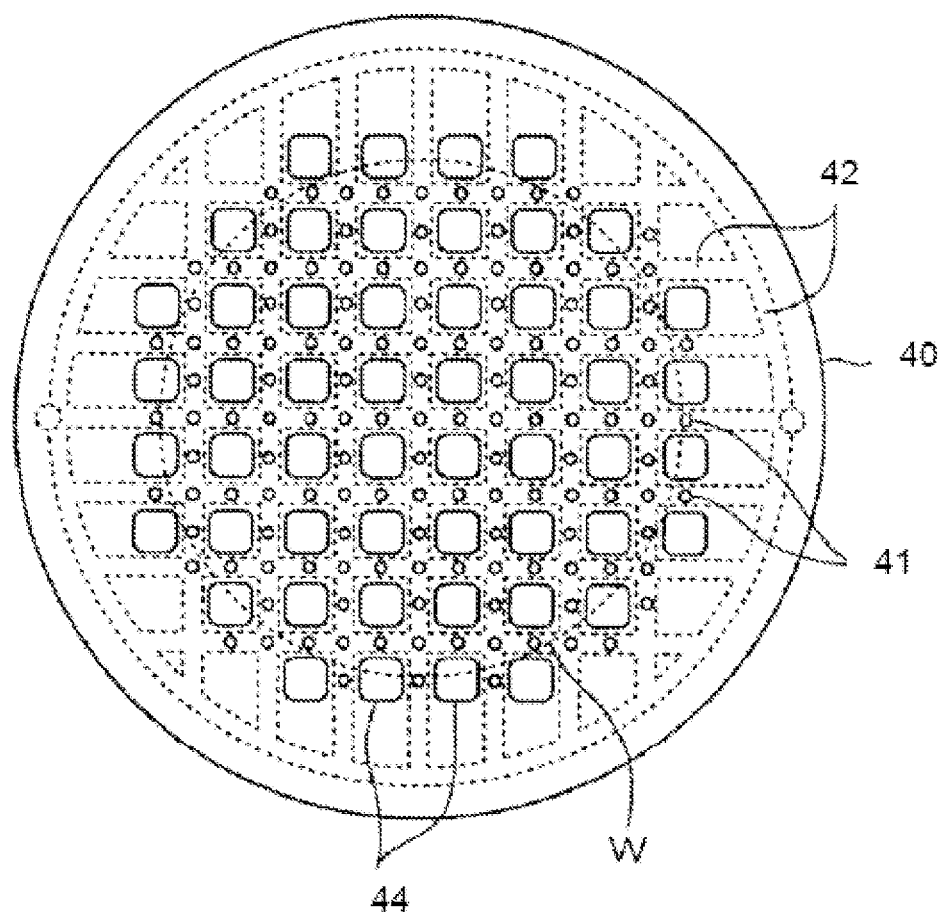
FIG. 8 illustrates a plan view of a gas supplying unit of the plasma processing system in FIG. 7.

A plan view of the process gas supply unit 40 is shown in FIG. 8. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. Similar to the previous case, the plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., argon (Ar) gas, helium (He) gas, or other inert gases, into the plasma diffusion region R2 at the substrate holder 21 side. As shown in FIG. 8, the plurality of opening 44 is formed between the adjacent gas flow channels 42.

The process gas is supplied, for example, from three separate process gas supply source 45-47 to the process gas supply port 43. The process gas supply sources 45-47 correspond respectively to a silicon-containing gas (e.g., $SiH_4$), a deposition gas having a carbon-nitrogen intermolecular bond (e.g., $NMe_3$), and an oxygen-containing gas (e.g., $O_2$). Still referring to FIG. 7, as used herein, the plasma gas and the process gas in combination form a non-metal-containing process gas. As for the flow rate of the non-metal-containing process gas, the flow rate of deposition gas and the silicon-containing gas may be set to a range within 10 sccm to 200 sccm. The flow rate of plasma gas, e.g., Ar gas, ranges from 100 sccm to 2000 sccm. The flow rate of oxygen-containing gas, e.g. $O_2$, is set within a range of 10 sccm to 100 sccm. A more detailed list of gases that may be used as the plasma gas and the process gas is described above in reference to FIG. 6. Further, a more detailed description of process parameters that may be used, including process chamber pressure and substrate temperature, is described above in reference to FIG. 6.

The one or more of the deposition gas, the silicon-containing, and the oxygen-containing gas flow through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the plasma gas, the deposition gas, the silicon-containing gas, and the oxygen-containing gas.

An external microwave generator 55 provides a microwave of a predetermined frequency, e.g., 2.45 GHz, to the antenna unit 50 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the plasma gas, e.g., Argon (Ar) gas, Helium (He) gas, or other inert gases, within the process chamber 20.

Figure 9:
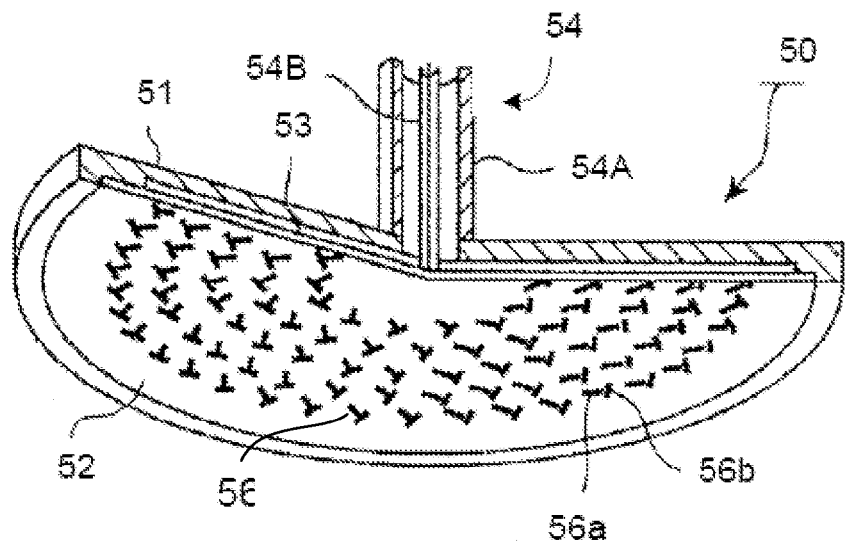
FIG. 9 illustrates a partial cross-sectional view of an antenna portion of the plasma processing system in FIG. 7.

FIG. 9 illustrates a partial cross-sectional view of the antenna unit 50 (RLSA). As shown in this figure, the antenna unit 50 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 are provided on the radial line slot plate 52 to generate a circular polarized wave. The plurality of slots 56 are arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. As shown in FIG. 7, the radial line slot plate 52 is mounted on the process chamber 20 using sealing members, not shown in FIG. 7, such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

Referring to FIG. 7, an external high-frequency power supply source 22 is electrically connected to the substrate holder 21 via a matching network 25. The external high-frequency power supply source 22 generates an RF bias power of a predetermined frequency, e.g. 13.56 MHz, for controlling energy of ions that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. Examplary RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes a DC voltage generator 35 capable of optionally supplying DC voltage bias between −5 kV and +5 kV to the substrate holder 21.

During the forming of the carbon-nitrogen-containing film, the plasma gas, e.g., Ar gas, may be introduced into the process chamber 20 using the plasma gas supply unit 30. On the other hand, the deposition gas, the silicon-containing gas, and the oxygen-containing gas and Ar as a carrier gas may be introduced into the process chamber 20 using the process gas supply unit 40. As shown in FIG. 7, the deposition gas, the silicon-containing gas, and the oxygen-containing gas may also be introduced into the process chamber 20 using the plasma gas supply unit 30.

A plurality of embodiments for forming carbon-nitrogen-containing films for semiconductor devices using a microwave plasma source have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
providing a substrate in a process chamber containing a microwave plasma source;
introducing in the process chamber a non-metal-containing process gas including a gas having a carbon-nitrogen intermolecular bond;
forming a plasma from the process gas; and
exposing the substrate to the plasma to deposit a carbon-nitrogen (CN) film with carbon and nitrogen as the major constituents and wherein an electron temperature of the plasma is less than the bond energy of C—H bonds in the gas having a carbon-nitrogen intermolecular bond.

2. The method of claim 1, wherein the microwave plasma source includes a radial line slot antenna.

3. The method of claim 1, wherein the gas having a carbon-nitrogen intermolecular bond includes an alkylamine selected from trimethylamine, dimethylethylamine, diethylmethylamine, triethylamine, dimethylamine, diethylamine, methylamine, ethylamine, or a combination thereof.

4. The method of claim 1, wherein the gas having a carbon-nitrogen intermolecular bond comprises HCN, $CH_3CN$, NCCN, or X—CN where X is a halogen, or a combination of two or more thereof.

5. The method of claim 1, further comprising
applying a radiofrequency (RF) bias voltage to a substrate holder supporting the substrate.

6. The method of claim 1, wherein the carbon-nitrogen intermolecular bond is a single chemical bond (C—N).

7. The method of claim 1, wherein the carbon-nitrogen intermolecular bond is a double chemical bond (C=N).

8. The method of claim 1, wherein the carbon-nitrogen intermolecular bond is a triple chemical bond (C≡N).

9. A method of forming a semiconductor device, comprising:
providing a substrate in a process chamber containing a microwave plasma source;
introducing in the process chamber a non-metal-containing process gas including an oxygen-containing gas, a gas having a carbon-nitrogen intermolecular bond, and a silicon-containing gas;
forming a plasma from the process gas; and
exposing the substrate to the plasma to deposit a silicon-doped carbon-nitrogen-oxygen (Si-doped CNO) film with carbon, nitrogen, and oxygen as the major constituents and 0.1-10 atomic % Si and wherein an electron temperature of the plasma is less than the bond energy of C—H bonds in the gas having a carbon-nitrogen intermolecular bond.

10. The method of claim 9, wherein the gas having a carbon-nitrogen intermolecular bond is selected from trimethylamine, dimethylethylamine, diethylmethylamine, triethylamine, dimethylamine, diethylamine, methylamine, ethylamine, or a combination thereof.

11. The method of claim 9, wherein the oxygen-containing gas comprises $O_2$, CO, $H_2O$, $H_2O_2$, NO, $N_2O$, or $NO_2$, or a combination of two or more thereof.

12. The method of claim 9, wherein the silicon-containing gas is selected from the group consisting of silane ($SiH_4$), disilane ($Si_2H_6$), and a $Si_aH_bX_c$ compounds where X is a halogen and a, b, c are integers greater than or equal to unity.

13. The method of claim 9, wherein the carbon-nitrogen intermolecular bond is a single chemical bond (C—N).

14. The method of claim 9, wherein the carbon-nitrogen intermolecular bond is a double chemical bond (C=N) or a triple chemical bond (C≡N).

* * * * *